United States Patent [19]

Biegelsen et al.

[11] Patent Number: 4,496,608
[45] Date of Patent: Jan. 29, 1985

[54] P-GLASS REFLOW TECHNIQUE

[75] Inventors: David K. Biegelsen, Portola Valley; Eric R. Sirkin, Mountain View, both of Calif.

[73] Assignee: Xerox Corporation, Stamford, Conn.

[21] Appl. No.: 585,678

[22] Filed: Mar. 2, 1984

[51] Int. Cl.³ .............................................. B05D 3/06
[52] U.S. Cl. .................................... 427/53.1; 427/55; 219/121 L
[58] Field of Search .............................. 427/53.1, 55; 219/121 L

[56] References Cited

U.S. PATENT DOCUMENTS

| | | | |
|---|---|---|---|
| 3,825,442 | 7/1974 | Moore | 117/212 |
| 3,887,733 | 6/1975 | Tolliver et al. | 427/444 |
| 4,279,671 | 7/1981 | Komatsu | 148/188 |
| 4,284,659 | 8/1981 | Jaccodine et al. | 427/53.1 |
| 4,318,752 | 3/1982 | Tien | 148/1.5 |
| 4,355,454 | 10/1982 | Tasch, Jr. et al. | 29/571 |
| 4,414,242 | 11/1983 | Nishimura et al. | 427/43.1 |

OTHER PUBLICATIONS

*Electronics,* Nov. 17, 1983, "IEDM Ideas Foreshadow Future Circuit Solutions" by R. Godin.
International Electron Devices Meeting, Dec. 5–7, 1983, Washington DC, "Multilayer CMOS Device Fabricated on Laser Recrystallized Silicon Islands", and Indirect Laser Annealing of Polysilicon for 3-Dimensional IC's.
IBM Technical Disclosure Bulletin, vol. 23, No. 9, Feb., 1981, "Method for Laser Annealing of Polysilicon With Reduced Damage" by J. Leas and J. Lloyd.

*Primary Examiner*—John H. Newsome
*Attorney, Agent, or Firm*—Richard A. Tomlin

[57] ABSTRACT

P-glass is heated to reflowing temperature by the radiant heating of a material overlying the P-glass layer. The coating layer is chosen such that its reflectivity increases at its melting temperature, and that temperature corresponds to the P-glass reflow temperature. Increased radiant heating will not increase the energy absorbed by the coating because more of the radiation is reflected. The temperature of the coating is thus limited providing controlled conductive heating of the P-glass layer.

3 Claims, 2 Drawing Figures

P-GLASS REFLOW TECHNIQUE

Phosphosilicate glass (P-glass) is the most common insulating layer used in integrated circuits before metallization. To avoid metallization failures due to excessively steep steps formed in the P-glass deposition process, the P-glass is heated to cause the P-glass to flow and thus smooth the steps. The high temperature treatment also eliminates pinholes in the P-glass layer. Temperatures exceeding 1000° C. are commonly used. These extreme temperatures, however, can have a detrimental effect on the doped metal oxide semiconductor (MOS) materials underlying the P-glass causing significant diffusion of the dopants. The corresponding lateral diffusion is a particularly serious limitation for one micron or submicron MOS devices. The P-glass flow temperature can be decreased by increasing the phosphorous concentration, but the hydroscopic nature of heavily doped P-glass leads to fabrication and reliability problems. Another method of reducing the problem is to use transient localized heating with laser beams to minimize substrate heating. The laser radiation heating of the P-glass layer, however, depended on the topography of the material and the varying optical properties of the underlayers.

The invention as claimed is intended to provide a remedy for the above problems and provide further improvement. A method is proposed that can provide for the reflowing of the P-glass layer with minimum heating of the substrate and independent of the optical properties of the glass and underlayers. Furthermore, the absorbing layer manifests a self-limiting temperature mechanism thereby obviating tight control of radiant intensities, which means that a wide variety of radiant energy sources, such as flash lamps, strip heaters and ovens, may be used as well as laser sources.

The above advantages are obtained by coating the P-glass layer with a material whose reflectivity increases markedly on melting. The melted coating heats the P-glass layer by conduction.

The method of this invention will better be understood by reference to the following specification, and particularly when the specification is taken in conjunction with the drawing in which:

FIG. 2A shows a side sectional view of the coated device of FIG. 1A after the method of this invention has been performed on it. The various layers are not drawn to scale.

Figure 1A:
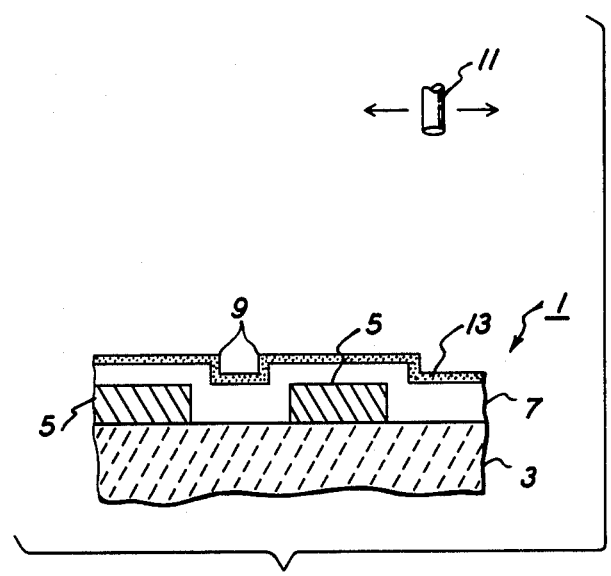
FIG. 1A shows a side sectional view of a coated device suitable for use in the present invention.
Figure 1B:
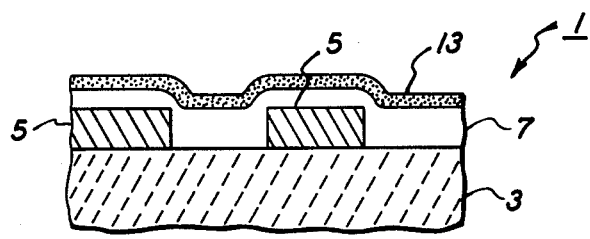

Referring now to FIG. 1A, there is shown a P-glass coated device shown generally as 1. P-glass coated device 1 in this exemplary instance is made up of a silicon wafer substrate 3 on which a conductor pattern 5 has been formed. Coated over the conductor pattern 5 and silicon wafer substrate 3 is a layer 7 of P-glass which acts as an insulating encapsulant for silicon wafer substrate 3 and conductor pattern 5. The coating process causes the formation of sharp edges 9 which can interfere with later metallization. Further, the P-glass layer 7 often contains pinholes (not shown) which can affect device 1 performance and lead to subsequent degradation. To eliminate these problems, the P-glass layer 7 is brought to or near to its melting point to "reflow" the P-glass layer 7, thus smoothing the edges 9 and sealing the pinhole leaks. To accomplish this reflow in a controlled manner with a minimum amount of heat being transferred to conductor pattern 5 and silicon wafer substrate 3, a laser or other radiation source 11 is provided, and a radiation absorbing coating 13 is provided over P-glass layer 7. Radiation absorbing coating 13 is formulated to absorb radiation energy and to increase its reflectivity upon heating. Radiation source 11 may be provided if desired with means for scanning over the P-glass coated device 1.

In operation, source 11 exposes P-glass coated device 1 at a predetermined power output. Radiation absorbing coating 13 absorbs the radiation keeping the radiation from penetrating to P-glass layer 7, conductor pattern 5 and silicon wafer substrate 3. As the radiation is absorbed, the temperature of radiation absorbing coating 13 rises rapidly. As the temperature of radiation absorbing coating 13 increases to its melting point, its reflectivity increases, thus limiting the energy absorbed by radiation absorbing coating 13. The P-glass layer 7, which is in intimate contact with heated radiation absorbing coating 13, is heated by conduction. By controlling the exposure time and exposure power, the P-glass layer 7 may be rapidly heated to its reflow condition without deleterious heating of conductive pattern 5 or silicon wafer substrate 3.

In an example, a silicon wafer substrate 3 has a 0.4 micron thick layer of thermal silicon dioxide (not shown) grown on the silicon wafer substrate 3. Deposited on the silicon dioxide film is a conducting pattern 5 of polysilicon lines measuring about 0.4 microns by 2 microns. A 1.1 micron thick layer of P-glass layer 7 is formed over the conducting pattern 5 and silicon wafer substrate 3. A radiation absorption coating 13 comprising a 5% phosphorous doped polysilicon layer 13 approximately 3000 Ångstroms in thickness is deposited on P-glass layer 7. A laser radiation source is used. The laser is an Edinburgh Instruments Model P63 CW tunable laser having a maximum output power of about 30 watts at 9.25 microns. The beam is focused to a spot of about 90–150 microns using a germanium lens of 50 mm focal length. The P-glass coated device 1 is held at room temperature on a stepping motor driven stage (not shown). The maximum scanning velocity is about 1.6 mm/sec. As polysilicon layer 13 melts, the surface becomes very smooth, shiny and highly reflective. P-glass coated devices 1 having improved P-glass layer 7 reflow characteristics are thus provided.

Although preferred materials were set out above, other suitable materials and concentrations could be used without departing from the scope and spirit of the invention. The reflectivity change can be due to chemical or mechanical changes in the laser radiation absorbing coating 13. For example, laser radiation absorbing coating 13 could be made of reflective particles dispersed in a softenable binder which, on heating, would allow the reflective particles to float to the top forming a reflective shield for the layer, thus limiting radiation absorption and resultant heating. Furthermore, the heating can be performed in imagewise configuration. For example, a metal layer above the absorbing layer, patterned by photolithography, would reflect incident irradiation and ensure reduced temperatures in the protected regions. All such variations and modifications should be considered as falling within the scope of the appended claims.

What is claimed is:

1. A method for reflowing a P-glass layer which comprises:

(a) overcoating said P-glass layer with a radiation absorbing material whose reflectivity increases upon melting;
(b) exposing said radiation absorbing material to radiation to heat said radiation absorbing material to its melting point; and
(c) continuing the radiation exposure of said radiation absorbing material until said P-glass layer has reflowed, said P-glass layer being heated at least in part by conduction of heat from said radiation absorbing material.

2. The method of claim 1 wherein said radiation is provided by a laser.

3. The method of claim 1 wherein said radiation absorbing material is a phosphorous doped polysilicon.

* * * * *